Figure 1:
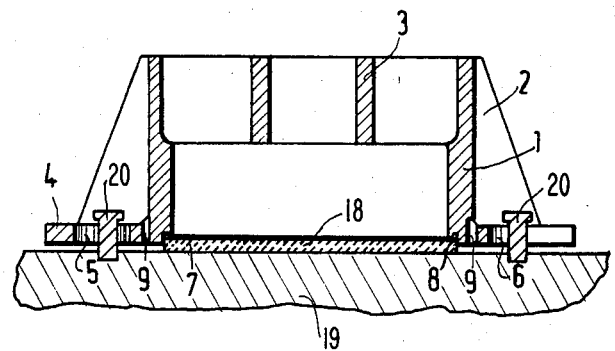

United States Patent [19]

Neidig et al.

[11] Patent Number: 4,636,580
[45] Date of Patent: Jan. 13, 1987

[54] STATIC CONVERTER MODULE WITH MOUNTING LUGS

[75] Inventors: Arno Neidig, Plankstadt; Bernd Leukel, Weinheim; Hubert Hettmann, Hockenheim, all of Fed. Rep. of Germany

[73] Assignee: Brown, Boveri & Cie AG, Mannheim-Käfertal, Fed. Rep. of Germany

[21] Appl. No.: 800,082

[22] Filed: Nov. 8, 1985

Related U.S. Application Data

[62] Division of Ser. No. 585,981, Mar. 5, 1984, abandoned.

[30] Foreign Application Priority Data

Mar. 4, 1983 [DE] Fed. Rep. of Germany ....... 3307704

[51] Int. Cl.⁴ ............................................. H05K 7/20
[52] U.S. Cl. ........................... 174/52 PE; 174/16 HS; 361/388
[58] Field of Search ................................ 361/386–388, 361/395, 399, 417, 419, 420, 426, 427, 377; 174/52 PE, 16 HS, 138 G, DIG. 2; 357/81; 363/141

[56] References Cited

U.S. PATENT DOCUMENTS

| | | | |
|---|---|---|---|
| 3,805,117 | 4/1974 | Hausman | 361/395 |
| 3,876,926 | 4/1975 | Schott | 361/387 |
| 4,218,724 | 9/1980 | Kaufman | 361/395 |
| 4,237,435 | 12/1980 | Cooper | 361/395 |
| 4,346,396 | 8/1982 | Carroll, II | 357/81 |
| 4,394,530 | 7/1983 | Kaufman | 361/388 |

FOREIGN PATENT DOCUMENTS 3127457  2/1983  Fed. Rep. of Germany .

*Primary Examiner*—G. P. Tolin
*Attorney, Agent, or Firm*—Herbert L. Lerner; Laurence A. Greenberg

[57] ABSTRACT

In this static converter module, which is equipped with thyristors, diodes or power transistors, mounting lugs (4,11) having mounting holes (5,6,12,13) are used for mounting the module on a heat sink. The housing of the module is essentially formed by a frame (1,10) which is open at the top and at the bottom and by a ceramic plate which is inserted into the base part of the frame. For the purpose of fixing the ceramic plate in place, a peripheral indentation (7,15) is provided in the base part of the frame. In order to prevent mechanical stresses in the area of the mounting holes/mounting lugs from being transmitted to the ceramic plate, slits (9) are provided between the frame walls and the mounting holes. As an alternative to this, the peripheral indentation (15) can be provided with steps in such a manner that in the area of the two frame walls provided with the mounting lugs (11) a slot-shaped recess (16) is produced between the ceramic plate and the peripheral indentation (15).

3 Claims, 4 Drawing Figures

U.S. Patent     Jan. 13, 1987     4,636,580

STATIC CONVERTER MODULE WITH MOUNTING LUGS

This application is a division of application Ser. No. 585,981 filed Mar. 5, 1984, now abandoned.

The invention relates to a static converter module with mounting lugs in accordance with the preamble clause of claim 1.

Such a static converter module with mounting lugs is known from German Offenlegungsschrift No. 3,127,457. The semiconductor components used are in particular thyristors and diodes.

The module is mounted on a heat sink by means of mounting screws and shims. The disadvantage of this arrangement is that the torques for the mounting screws must be limited to certain values which requires the use of an accurately adjusted torque wrench. If mounting screws with an M5 thread are used, the tightening torque must be limited, for example, to 2 Nm.

Apart from the risk of distorting the plastic at the pressure point of the shim, the torque is limited primarily for the reason of preventing an unacceptably high mechanical stressing of the ceramic plate in the area of the mounting holes since otherwise the risk of ceramic fractures exists which results in a lack of insulation capability. This effect has a disturbing influence particularly if high-quality fiberglass-reinforced plastics are used for the frame including the mounting lugs and if the ceramic substrate extends close to the mounting holes because of better area utilization (better heat dissipation).

On the basis of these facts, the invention is based on the object of specifying a static converter module with mounting lugs of the type which was mentioned initially in which module cracks in the ceramic plate are reliably prevented even if the tightening torques of the mounting screws are too high.

This object is achieved for a first variant by the features defined in claim 1 and for a second variant by the features defined in claim 2.

The advantages which can be gained with the invention are especially that a direct transfer of the mechanical stress field in the area of the mounting screws to the brittle and fracture-sensitive ceramic plate is prevented in both variants. This makes the mounting of modules constructed in this manner on heat sinks much less critical. The uniform tightening of the mounting screws on both sides with a torque wrench can be omitted.

Figure 2:
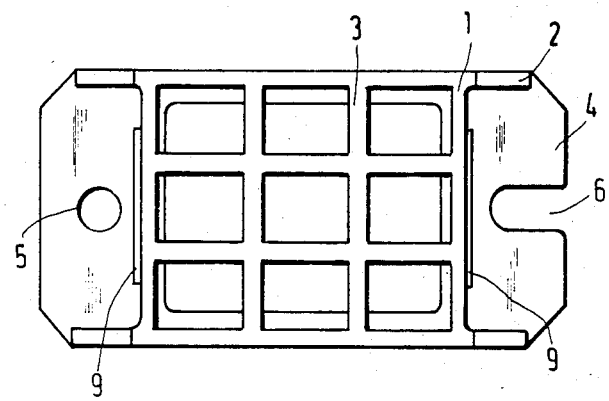
Figure 3:
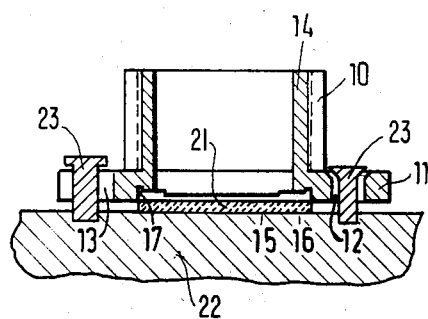
Figure 4:
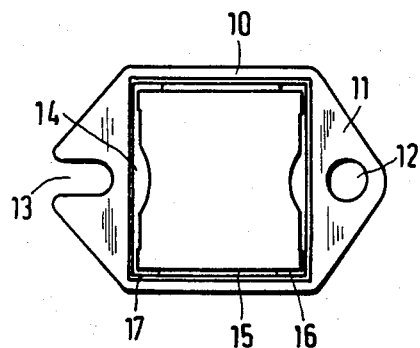

In the text which follows, illustrative embodiments of the invention are explained with the aid of the drawings in which:

FIG. 1 shows a section through the long side of a first static converter module variant, FIG. 2 shows a top view of the first static converter module variant, FIG. 3 shows a section through the long side of a second static converter module variant, and FIG. 4 shows the second static converter module variant in a view from underneath.

In FIG. 1, a section through the long side of a first static converter module variant is shown. The module has a frame 1 which is open at the top and at the bottom and which is used as the housing wall. The two narrow sides of the frame 1 have stiffening edges 2. In order to increase strength, the frame 1 also has several ribs 3 running parallel to the long side and to the narrow side, respectively. In the static converter module of the first variant, two ribs 3 run parallel to the long side and two ribs 3 parallel to the narrow side. This results in nine rectangular cells for accommodating electric connection elements (not shown) (plug-in contacts, preferably flat plugs) for the module. The ribs 3 are used for extending the leakage path between the connection elements. The two narrow sides of the frame 1 have mounting lugs 4 at the level of the base area. These mounting lugs 4 are provided with a hole 5 or a U-shaped recess 6, respectively, for mounting the static converter module on a heat sink 19.

The housing of the static converter module is formed, on the one hand, by the frame 1, and on the other hand by a ceramic plate 18 which is placed onto the open frame 1 in a peripheral recess 7 of its base area. This ceramic plate is provided with metallizations as conductor tracks and contact areas for soldering on connecting elements, semiconductor components (preferably thyristors and diodes) and internal connecting lugs in a hybrid manner of construction.

The frame 1 and the ceramic plate are bonded to each other. In order to fix the ceramic plate accurately in place, the frame 1 has the abovementioned peripheral recess 7 in its base area, the depth of which recess approximately corresponds to the thickness of the ceramic plate. A peripheral groove 8 provided in this recess 7 of the frame 1 is here used for accommodating any emerging adhesive. The excessive adhesive migrates into the groove 8 and does not swell over the edge of the ceramic plate onto the cooling surface.

Between the wall of the housing and the hole 5 or between the wall of the housing and the U-shaped recess 6, respectively, in each case a slit 9 is provided. The two slits 9 prevent mechanical stresses in the area of the mounting screws 20 of the hole 5 or of the U-shaped recess 6 from being transferred to the ceramic plate when the module is mounted on a heat sink. The tightening torques for the mounting screws no longer need to be limited, that is to say a torque wrench is no longer required for mounting the module.

The lower part of the static converter module is filled with a soft casting compound, for example silicone rubber and its center part is filled with a hard casting compound, for example epoxy resin.

As the material for the frame 1 including stiffening edges 2, ribs 3 and mounting lugs 4 preferably a high-quality fiberglass-reinforced plastic is used.

FIG. 2 shows a top view of the first static converter module variant. Essentially, the nine rectangular cells which are used for accommodating connection elements and which are formed by the wall of the frame 1 and the ribs 3 and the mounting lugs 4 with mounting holes 5, 6, can be seen. The length of the slit 9 provided between the frame wall and the hole 5 or U-shaped recess 6 corresponds approximately to half the width of the modules.

FIG. 3 shows a section through the long side of a second static converter module variant which is preferably suitable for power transistors. This static converter module is constructed to be smaller and more compact than the first module variant and also has a frame 10, which is open at the top and at the bottom, as a housing wall. For the purpose of mounting the module on a heat sink 22, mounting lugs 11 are provided at the level of the base area, as in the first static converter module variant, and has a (chamfered) hole 12 or a U-shaped recess 13. Since, due to the compact module construction, these mounting holes are very close to the housing wall, the frame 10 has semicircular recesses 14 which project into the interior of the housing at the location of the mounting holes. These recesses 14 are dimensioned in such a manner that the mounting holes can easily be provided with shims and any subsequent screwing on by means of mounting screws 23 can be done in a simple manner.

In order to fix the electrically insulating ceramic plate 21, which has to be bonded to the frame 10, in place a peripheral indentation 15 is again provided in the base part of the frame 1. This peripheral indentation 15, the depth of which corresponds at the most to the thickness of the ceramic plate, is provided with steps in such a manner that in the area of the two frame walls provided with the mounting lugs 11 a slot-shaped recess 16 is produced between the peripheral indentation and the ceramic plate placed on it. In the area of the remaining two frame walls, the ceramic plate is directly supported on the peripheral indentation 15.

In order to accommodate any adhesive which may emerge, a peripheral groove 17 again is provided.

In this second static converter module variant a transfer of mechanical stresses in the area of the mounting lugs 11 to the ceramic plate is also prevented by the stepping in the peripheral indentation 15 in the housing base. As a result of the existing slot-shaped recess 16, this stepping prevents any direct contact of the part facing the mounting lugs 11 of the peripheral indentation 15 with the ceramic plate. If the mounting lugs are tightened with too high a tightening torque, the part, provided with the slot-shaped recess 16, of the peripheral indentation 15 is deformed in the direction of the ceramic plate. However, the gap width of the recess 16 is dimensioned in such a manner that during this deformation no mechanical stresses at all are transferred to the ceramic plate.

In FIG. 4 the second static converter module variant is shown in a view from below, in which in particular the stepping of the peripheral indentation 15 in the base part of the frame 10 can be seen.

The transfer of mechanical stresses to the ceramic plate can be prevented in accordance with the second variant, in particular in the case of static converter modules, in which the space between the frame wall and the mounting hole is too narrow for arranging a slit.

We claim:

1. A module for a static converter, comprising a housing including:
   a top part in the form of a frame being open at the bottom and top defining lateral surfaces, a lower edge and an interior, and mounting lugs formed on said lateral surfaces at a given height, said mounting lugs having mounting holes formed therein for receiving means for mounting the module on a heat sink; and
   a bottom part in the form of a ceramic plate having a lower surface disposed entirely on the heat sink when mounted, said ceramic plate being at least partially disposed in a peripheral indentation formed in said lower edge in said interior of said frame substantially at said given height; and
   means for preventing a mechanical stress field from being transmitted directly from the mounting means to said ceramic plate when mounted, said transmission prevention means being in the form of slits separate from said peripheral indentation and said mounting holes, each of said slits being formed in a respective one of said mounting lugs substantially parallel to a respective one of said lateral surfaces between a respective one of said lateral surfaces and a respective one of said mounting holes.

2. A module for a static converter, comprising a housing including:
   a top part in the form of a frame having sides and being open at the bottom and top defining lateral surfaces, a lower surface with a lower edge and an interior, and two mounting lugs formed on said lateral surfaces at opposite sides of said frame at a given height, said mounting lugs having a lower surface and having mounting holes formed therein for receiving means for mounting the module on a heat sink; and
   a bottom part in the form of a ceramic plate having a lower surface disposed entirely on the heat sink when mounted and an upper surface facing said interior of said frame, said ceramic plate being at least partially disposed in a peripheral indentation formed in said lower edge of said frame at said lower surface of said mounting lugs facing said interior of said frame substantially at said given height, said peripheral indentation being perpendicular to said upper surface of said ceramic plate defining an upper surface of said peripheral indentation; and
   means for preventing a mechanical stress field from being transmitted directly from the mounting means to said ceramic plate when mounted, said transmission prevention means being in the form of a recess formed in said lower surface of said frame separate from said mounting holes and said peripheral indentation between said upper surface of said ceramic plate and said upper surface of said peripheral indentation.

3. A module according to claim 2, wherein said recess defines a space between said upper surface of said ceramic plate and said frame.

* * * * *